United States Patent
Vallet

(10) Patent No.: US 7,196,421 B2
(45) Date of Patent: Mar. 27, 2007

(54) INTEGRATED CIRCUIT HAVING AT LEAST ONE METALLIZATION LEVEL

(75) Inventor: Michel Vallet, Vaulnaveys le Haut (FR)

(73) Assignee: STMicroelectronics SA, Montrouge (FR)

( * ) Notice: Subject to any disclaimer, the term of this patent is extended or adjusted under 35 U.S.C. 154(b) by 67 days.

(21) Appl. No.: 10/839,770

(22) Filed: May 5, 2004

(65) Prior Publication Data
US 2005/0006772 A1    Jan. 13, 2005

(30) Foreign Application Priority Data
May 5, 2003    (FR) .................................. 03 05433

(51) Int. Cl.
*H01L 23/48* (2006.01)
(52) U.S. Cl. .................. 257/758; 257/757; 257/760; 257/E21.564; 438/462
(58) Field of Classification Search ................ 257/758, 257/757, 760
See application file for complete search history.

(56) References Cited
U.S. PATENT DOCUMENTS

| 5,441,915 | A | * | 8/1995 | Lee | ............................ 438/631 |
|---|---|---|---|---|---|
| 5,854,125 | A | * | 12/1998 | Harvey | ........................ 438/626 |
| 6,255,697 | B1 | * | 7/2001 | Yoo et al. | .................... 257/365 |
| 2001/0010387 | A1 | | 8/2001 | Yoo et al. | |
| 2001/0022399 | A1 | | 9/2001 | Koubuchi et al. | |
| 2001/0041425 | A1 | | 11/2001 | Ohsumi et al. | |
| 2002/0043715 | A1 | | 4/2002 | Takizawa | |

FOREIGN PATENT DOCUMENTS

JP          06061230         3/1994

\* cited by examiner

*Primary Examiner*—Andy Huynh
*Assistant Examiner*—Thinh T Nguyen
(74) *Attorney, Agent, or Firm*—Lisa K. Jorgenson; Stephen Bongini; Fleit, Kain, Gibbons, Gutman, Bongini & Bianco P.L.

(57) ABSTRACT

An integrated circuit is provided that includes at least one metallization level having a plurality of dummy conductors. At least one of the dummy conductors has an oriented shape made up of a plurality of non-parallel rectangles in mutual contact. In one embodiment, the at least one dummy conductor is in the form of an "L". In another embodiment, the at least one dummy conductor is in the form of a Latin cross. In yet another embodiment, the at least one dummy conductor is in the form of a "T".

15 Claims, 1 Drawing Sheet

INTEGRATED CIRCUIT HAVING AT LEAST ONE METALLIZATION LEVEL

CROSS-REFERENCE TO RELATED APPLICATIONS

This application is based upon and claims priority from prior French Patent Application No. 03-05433, filed May 5, 2003, the entire disclosure of which is herein incorporated by reference.

BACKGROUND OF THE INVENTION

1. Field of the Invention

The present invention relates to integrated circuits, and more particularly to integrated circuits having at least one metallization level and associated fabrication processes.

2. Description of Related Art

Conventional integrated circuits are surmounted by a plurality of interconnect layers comprising an alternation of conducting layers (also known as "metallization levels") that are provided with metallized conducting lines extending parallel to the layer, and insulating layers that are penetrated by conducting vias for making electrical connections between two metallization levels.

A metallization level comprises a plurality of conducting lines surrounded by regions made of a dielectric. The local metal density due to the presence of the conducting lines may vary greatly within one and the same metallization level.

However, a low metal density in a localized region of a metallization level poses fabrication problems.

More specifically, when the conducting lines are based on aluminum, an aluminum layer is deposited on a dielectric layer. The aluminum layer is then etched in order to leave only the conducting lines. A layer of dielectric, for example silicon oxide, is then deposited in order to fill the empty spaces left between the conducting lines and to ensure their mutual isolation, and to form a dielectric layer above that metallization level.

A chemical-mechanical polishing (or CMP) step is then carried out in order to reduce the thickness and unevenness of the dielectric, and to obtain a planar surface so that the upper metallization levels can be properly formed. However, during deposition of the dielectric, the absence of metal in a localized area results in a hollow in the upper surface of the deposited dielectric layer, which hollow may be so large that the chemical-mechanical polishing is unable to make the surface of the dielectric layer even. As a result, a hollow remains, which seriously impairs the subsequent fabrication steps.

Similarly, if the conducting lines are made of copper, the positions of the future conducting lines are etched in a thick layer of dielectric and then filled with copper. This operation is then followed by chemical-mechanical polishing of the upper surface of the circuit being fabricated, so as to remove the excess copper and obtain a planar surface with which the conducting lines are flush.

If a localized area is devoid of copper, there is a risk, after the chemical-mechanical polishing, of an excess thickness of dielectric remaining, which the polishing was unable to remove. Again, this surface unevenness has serious drawbacks for the subsequent integrated circuit fabrication steps.

One known approach to solve this problem is to insert floating conductors, which are known as "dummy" conductors since they are of no electrical use, in the areas of low metal density of a metallization level. The entire metallization level then has a relatively uniform metal density, so as to optimize the efficiency of the fabrication processes. The dummy conductors are of greater importance the narrower the conducting lines become, so as to increase the interconnect density. However, the presence of such dummy conductors modifies the electrical characteristics of the interconnects around which they are placed, forming parasitic capacitances, with the risk of compromising the proper operation of the entire integrated circuit, and even more so as the conducting lines become narrower.

The technological evolution tending to increase the integration density, and therefore to reduce the width of the conducting lines, makes circuits more and more sensitive from the electrical standpoint to the presence of dummy conductors. Increasing the clock frequency of integrated circuits makes them more sensitive to parasitic capacitances, especially due to the longer propagation times that they cause.

The dummy conductors are generally in the form of square pads in the areas of low metal density of a metallization level. It would be conceivable to decrease the size of the dummy conductors so as to reduce the parasitic capacitances that they form with neighboring lines. However, the fabrication of a very large number of small dummy conductors has drawbacks in terms of circuit simplicity and fabrication yield. The presence of a very large number of small dummy conductors impedes post-fabrication analysis of defects, because of the screen formed which blocks the photon images and more generally the transmission of any type of photon, for example in HCMOS 9 technology. Thus, focused ion beam imaging, laser-induced circuit modification, infrared microscopy, observation by optical microscopy, laser marking, and so on may all be impeded by the presence of a very large number of small dummy conductors.

SUMMARY OF THE INVENTION

In view of these drawbacks, it is an object of the present invention to overcome these drawbacks and to provide an integrated circuit with dummy conductors in which defect analysis is possible, especially in advanced technologies.

Another object of the present invention to provide an integrated circuit whose dummy conductors can act as alignment marks.

One embodiment of the present invention provides an integrated circuit that includes at least one metallization level having a plurality of dummy conductors. At least one of the dummy conductors has an oriented shape made up of a plurality of non-parallel rectangles in mutual contact. In one embodiment, the at least one dummy conductor is in the form of an "L". In another embodiment, the at least one dummy conductor is in the form of a Latin cross. In yet another embodiment, the at least one dummy conductor is in the form of a "T".

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
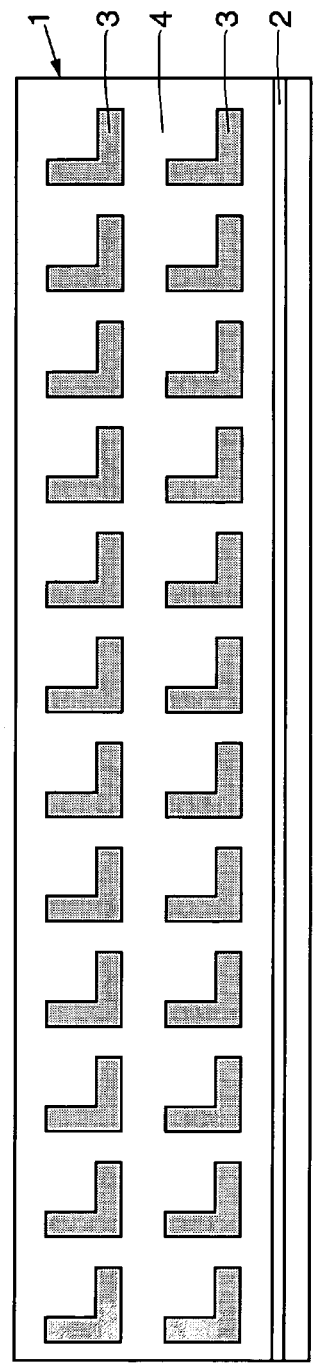
FIG. 1 is a top view of a metallization level according to a first embodiment of the present invention.

Preferred embodiments of the present invention will be described in detail hereinbelow with reference to the attached drawings.

Preferred embodiments of the present invention provide an integrated circuit that includes at least one metallization level provided with a plurality of dummy conductors. At least one of the dummy conductors has an oriented shape made up of non-parallel rectangles in mutual contact. Thus, it is possible to reduce the density of dummy conductors, and hence to provide better visibility of the structures placed beneath the dummy conductors. The polishing is not impeded thereby. The dummy conductors may be placed near the metallized pads.

Preferably, the circuit includes a plurality of metallization levels. The term "metallization level" means a conducting layer bounded by a lower plane and a parallel upper plane. The dummy conductor is placed in the conducting layer between the lower plane and the upper plane. A conducting line of a metallization level is placed parallel to certain conducting lines of the same metallization level and perpendicular to the other conducting lines of the same metallization level.

In preferred embodiments, the one dummy conductor consists of two perpendicular rectangles. In one embodiment, a short side of one of the rectangles is in continuous contact with a long side of the other rectangle, and the two rectangles have the same dimensions. In some embodiments, the one dummy conductor is in the form of an "L". In some embodiments, the one dummy conductor is in the form of a Latin cross or a "T". Preferably, multiple dummy conductors are aligned and oriented in an identical manner. In one embodiment of the present invention, the rectangles have a width of less than about 2 µm. In one embodiment of the present invention, the rectangles have a length of between about 2 and 10 µm, and preferably between about 4 and 6 µm.

In one embodiment of the present invention, the metallized pads of the integrated circuit include an upper layer based on aluminum. In some embodiments of the present invention, the dummy conductors comprise aluminum or copper. In some embodiments, the dummy conductors include an upper layer based on aluminum or copper.

In one embodiment of the present invention, the degree of metallization of the surface on which the dummy conductors are provided is less than 35%, and preferably less than 25%, and more preferably between 10 and 20%.

In one embodiment of the present invention, the metallization level is an interconnect level.

In another embodiment of the present invention, the metallization level is a gate level. This is useful because the level comprising the transistor gates of an integrated circuit formed above the substrate has a variable local metal density that poses fabrication problems similar to those of the interconnect metallization levels. Provision is therefore made for there to be dummy conductors therein and the present invention applies thereto with advantages similar to those afforded in the case of interconnect metallization levels. Thus, the conductors may be conducting lines for metallization levels or connections at the gate polysilicon level.

Accordingly, the present invention facilitates post-fabrication analysis of the integrated circuit and any intervention for the purpose of modifying the circuit, while maintaining a simple design of the dummy conductors. This facilitates design and maintains a reasonable size of the file in which the designs are stored.

Exemplary embodiments of the present invention will now be described in detail with reference to FIG. 1–3. FIG. 1 shows a portion of a metallization level according to a first embodiment of the present invention. However, FIG. 1 also represents an illustration of a gate level that has the same arrangement.

As shown, an integrated circuit 1 comprises a metallization level provided with a conducting line 2 having an elongate general direction with parallel longitudinal edges. Of course, a metallization level comprises, as a general rule, a large number of such conducting lines, only one of which has been shown here for the sake of clarity of the drawings.

Placed close to one edge of the conducting line 2, and parallel thereto, is a row of dummy conductors 3, each of which is in the form of an "L" that is formed from two rectangles of equal dimensions, placed perpendicular to each other. One of the rectangles is parallel to the edge of the conducting line 2. In further embodiments, the rectangles may be oblique. In this embodiment, the width of a rectangle is between about 0.2 and 2 µm., and preferably between about 0.8 and 1.8 µm. (for example, about 1.5 µm.). The length of a rectangle is between about 2 and 10 µm., and preferably between about 4 and 6 µm. (for example, about 5 µm.). The distance between the ends of the dummy conductor rectangles of one row is between about 2 and 10 µm., and preferably between about 3 and 6 µm. (for example about 4 µm.).

The metallization level to which the conducting line 2 and the dummy conductors 3 belong is completed by a dielectric 4 that is located between the other elements.

The conventional square pad dummy conductors described above occupy 35% of the area in the case of squares having sides of 2.5 µm and separated by 2 µm. The largest free square area between such dummy conductors has sides of 2 µm. (i.e., has an area of 4 µm$^2$). In contrast, the dummy conductors according to the present invention provide a fill factor of 15.75%. The largest free square area between the dummy conductors has sides of 7.5 µm (i.e., has an area of 56.25 µm$^2$). The free area through which the photons can pass, for circuit verification and/or modification operations, is thus increased by more than 1300%.

In an alternative embodiment, the dummy conductors have a width of about 1 µm and a length of about 6 µm, and are separated by about 2 µm. The largest free square area between such dummy conductors has sides of 8 µm (i.e., has an area of 64 µm$^2$). Thus, there is an increase in free area of 1500%.

Figure 2:
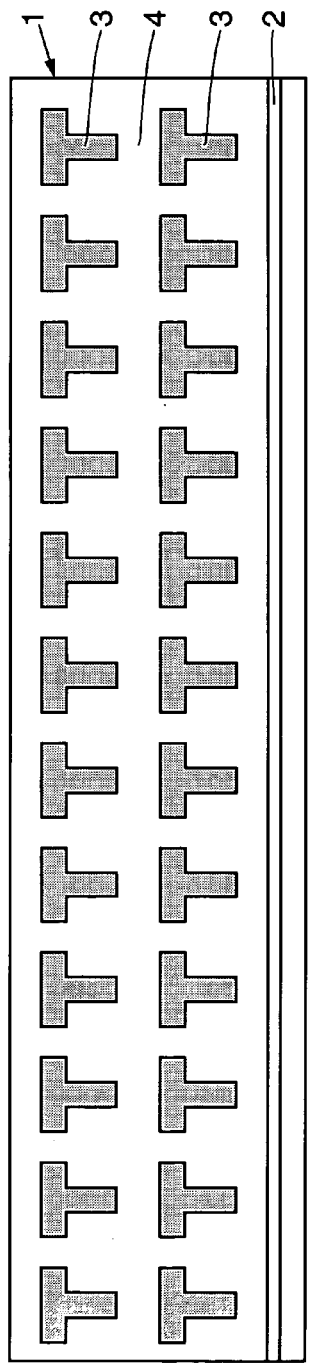
FIGS. 2 and 3 are top views of metallization levels according to further embodiments of the present invention.

FIG. 2 illustrates a metallization level according to a second embodiment of the present invention. In this variant of the embodiment of FIG. 1, the dummy conductors are in the form of a "T", with the middle of one rectangle of a dummy conductor joining one end of the other rectangle. thus, the shape of the dummy conductors allows the integrated circuit to be oriented.

Figure 3:
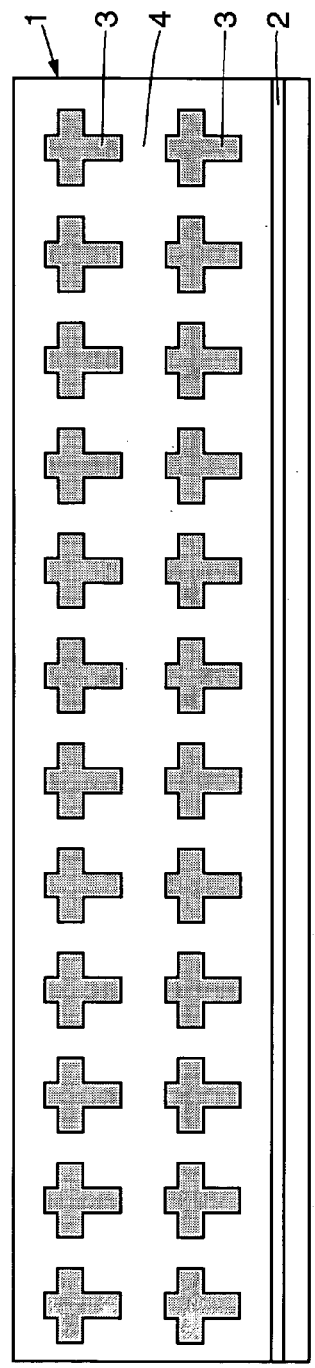

FIG. 3 illustrates a metallization level according to a third embodiment of the present invention. In this variant of the embodiment of FIG. 1, the dummy conductors are in the form of a Latin cross, with a rectangle of one dummy conductor joining the middle of the other rectangle approximately one-third of the way along its length in this embodiment. As in the embodiments described above, the shape of the dummy conductors in the third embodiment allows the integrated circuit to be oriented.

In further embodiments, the dummy conductors have any shape intermediate between the second and third embodiments. A dummy conductor having a Greek cross shape is possible but less favorable because of its symmetry along two perpendicular coplanar axes.

In further embodiments, one of the rectangles may be square and the other rectangle not square. More generally, preferred embodiments the present invention provides dummy conductors having any geometrical shape formed from at least two rectangles and having less than two coplanar axes of symmetry.

In further embodiments of the present invention, the dummy conductors are formed from three rectangles, for example in the form of a "U", a cross of Lorraine, and so on. However, these more complex shapes require more voluminous design files to be stored.

Accordingly, embodiments of the present invention provide dummy conductors of oriented shape that are designed to expose large free areas. Thus, the dummy conductors are capable of fulfilling an alignment mark function and also allow the circuit to be checked by a photon and/or ion method, including in technologies with narrow conducting line widths, such as HCMOS 9 or HCMOS 10.

Production of the dummy conductors according to the present invention does not require a particular or additional fabrication step and is therefore economical.

In fact, the generation of a digital integrated circuit is generally divided into four general steps: a first (or design) step, a second step in which the designed circuit is validated by modeling and electrical simulation with possible modifications to the design, a third step in which the dummy conductors are added during generation of the etching mask, and a fourth step in which the component is produced. The addition of the dummy conductors is carried out by a conventional process, but with the specific geometrical features of the present invention.

The present invention therefore provides a novel geometry of the dummy conductors with the possibility of preserving the procedure for integrating these dummy conductors.

The present invention also applies to analog integrated circuits in which dummy conductors are provided, typically for electrical reasons, upstream of the generation of the etching mask.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit comprising:
   at least one metallization level that includes a plurality of dummy conductors,
   wherein at least one of the dummy conductors has an oriented shape made up of a plurality of non-parallel rectangles in mutual contact, the at least one dummy conductor being in the form of an "L" or in the form of a "T", and
   the degree of metallization of the surface of the one metallization layer that includes the dummy conductors is from about 10 to 20%.

2. The integrated circuit according to claim 1, wherein the at least one dummy conductor consists of two perpendicular rectangles.

3. The integrated circuit according to claim 2, wherein the at least one dummy conductor is in the form of an "L".

4. The integrated circuit according to claim 2,
   wherein each of the plurality of dummy conductors consists of two perpendicular rectangles in the form of an "L", and
   the plurality of dummy conductors are aligned and oriented in an identical manner.

5. The integrated circuit according to claim 2, wherein at least one of the dummy conductors is in the form of a Latin cross.

6. The integrated circuit according to claim 2, wherein the at least one dummy conductor is in the form of a "T".

7. The integrated circuit according to claim 2; wherein each of the rectangles has a width of less than about 2 μm.

8. The integrated circuit according to claim 7, wherein each of the rectangles has a length of from about 2 to 10 μm.

9. The integrated circuit according to claim 7, wherein each of the rectangles has a length of from about 4 and 6 μm.

10. The integrated circuit according to claim 2, wherein each of the rectangles has a length of from about 2 to 10 μm.

11. The integrated circuit according to claim 1, wherein the dummy conductors comprise aluminum.

12. The integrated circuit according to claim 1, wherein the dummy conductors include an upper layer based on aluminum or copper.

13. The integrated circuit according to claim 1, wherein the degree of metallization of the surface of the one metallization layer that includes the dummy conductors is between 10 and 20%.

14. The integrated circuit according to claim 1, wherein the one metallization layer is an interconnect level.

15. The integrated circuit according to claim 1, wherein the one metallization layer is a gate level.

* * * * *